(12) United States Patent
Konishi

(10) Patent No.: US 12,117,483 B2
(45) Date of Patent: Oct. 15, 2024

(54) INSPECTION SYSTEM AND INSPECTION METHOD

(71) Applicant: Tokyo Electron Limited, Tokyo (JP)

(72) Inventor: Kentaro Konishi, Yamanashi (JP)

(73) Assignee: Tokyo Electron Limited, Tokyo (JP)

(*) Notice: Subject to any disclaimer, the term of this patent is extended or adjusted under 35 U.S.C. 154(b) by 105 days.

(21) Appl. No.: 17/753,495

(22) PCT Filed: Sep. 7, 2020

(86) PCT No.: PCT/JP2020/033840
§ 371 (c)(1),
(2) Date: Mar. 4, 2022

(87) PCT Pub. No.: WO2021/054185
PCT Pub. Date: Mar. 25, 2021

(65) Prior Publication Data
US 2022/0334175 A1    Oct. 20, 2022

(30) Foreign Application Priority Data

Sep. 18, 2019   (JP) .................................. 2019-169728

(51) Int. Cl.
*G01R 31/28*   (2006.01)
*F28F 3/12*    (2006.01)

(52) U.S. Cl.
CPC ............ *G01R 31/2875* (2013.01); *F28F 3/12* (2013.01)

(58) Field of Classification Search
CPC ... G01R 31/2875; G01R 31/2874; F28F 3/12; H01L 21/67109; H01L 21/67248
See application file for complete search history.

(56) References Cited

U.S. PATENT DOCUMENTS

| 5,503,183 A * | 4/1996 | Fenn ................... G05D 23/1393 |
| | | 236/12.12 |
| 10,317,094 B2 * | 6/2019 | Sørensen ................ F24D 3/141 |
| 2009/0130780 A1 * | 5/2009 | Day ..................... C23C 16/4412 |
| | | 118/712 |
| 2016/0109508 A1 * | 4/2016 | Akaike .............. G01R 31/2874 |
| | | 324/750.03 |

(Continued)

FOREIGN PATENT DOCUMENTS

CN    108428645    8/2018
JP    2001-044176    2/2001

Primary Examiner — Dominic E Hawkins
(74) Attorney, Agent, or Firm — IPUSA, PLLC

(57) ABSTRACT

An inspection system includes first and second chiller units which supply first and second heating media controlled to first and second temperatures, respectively, where the second temperature is lower than the first temperature, a stage having a flow passage supplied with a heating medium mixed with the first and the second heating media at a desired mixing ratio, and a controller. The inspection system performs an inspection with respect to a substrate placed on the stage. The controller controls a process of measuring a temperature of the heating medium at an inlet of the flow passage and a temperature of the heating medium at an outlet of the flow passage, and a process of correcting the mixing ratio of the first and second heating media, based on a difference between the temperatures of the heating medium at the inlet and outlet, and a flow rate of the heating medium.

14 Claims, 11 Drawing Sheets

(56) References Cited

U.S. PATENT DOCUMENTS

| | | | |
|---|---|---|---|
| 2017/0357277 A1* | 12/2017 | Ono | F15B 13/0402 |
| 2018/0016880 A1* | 1/2018 | Elmer | E21B 43/122 |
| 2018/0233384 A1 | 8/2018 | Nagai et al. | |
| 2018/0354776 A1* | 12/2018 | Lee | B67D 3/0077 |

\* cited by examiner

INSPECTION SYSTEM AND INSPECTION METHOD

TECHNICAL FIELD

The present disclosure relates to inspection systems and inspection methods.

BACKGROUND ART

For example, Patent Document 1 describes a temperature control method for a plasma etching apparatus. In Patent Document 1, a heat quantity Q supplied to a wafer during a process is calculated from a first order approximation formula for calculating the heat quantity determined beforehand, based on a value of high-frequency power applied to a lower electrode. Next, a target difference value ΔT, which is a theoretical temperature difference between an inlet temperature and an outlet temperature of a coolant circulation passage, is calculated based on the heat quantity. Then, a temperature control is performed based on the target difference value ΔT.

PRIOR ART DOCUMENTS

Patent Document

Patent Document 1: Japanese Laid-Open Patent Publication No. 2001-044176

DISCLOSURE OF THE INVENTION

Problem to be Solved by the Invention

The present disclosure provides an inspection system which can perform a temperature adjustment of a substrate according to a thermal resistance between the substrate and a flow passage in an inspection system.

Means for Solving the Problem

According to one aspect of the present disclosure, an inspection system includes a first chiller unit configured to supply a first heating medium controlled to a first temperature; a second chiller unit configured to supply a second heating medium controlled to a second temperature lower than the first temperature; a stage having a flow passage supplied with a heating medium mixed with the first heating medium and the second heating medium at a desired mixing ratio; and a controller, wherein the inspection system performs an inspection with respect to a substrate placed on the stage, and the controller controls a process of measuring a temperature of the heating medium at an inlet of the flow passage and a temperature of the heating medium at an outlet of the flow passage, and a process of correcting the mixing ratio of the first heating medium and the second heating medium, based on a difference between the temperatures of the heating medium at the inlet and outlet, and a flow rate of the heating medium.

Effects of the Invention

According to the present disclosure, it is possible to perform a temperature adjustment of a substrate according to a thermal resistance between the substrate and a flow passage in an inspection system.

MODE OF CARRYING OUT THE INVENTION

Figure 1:
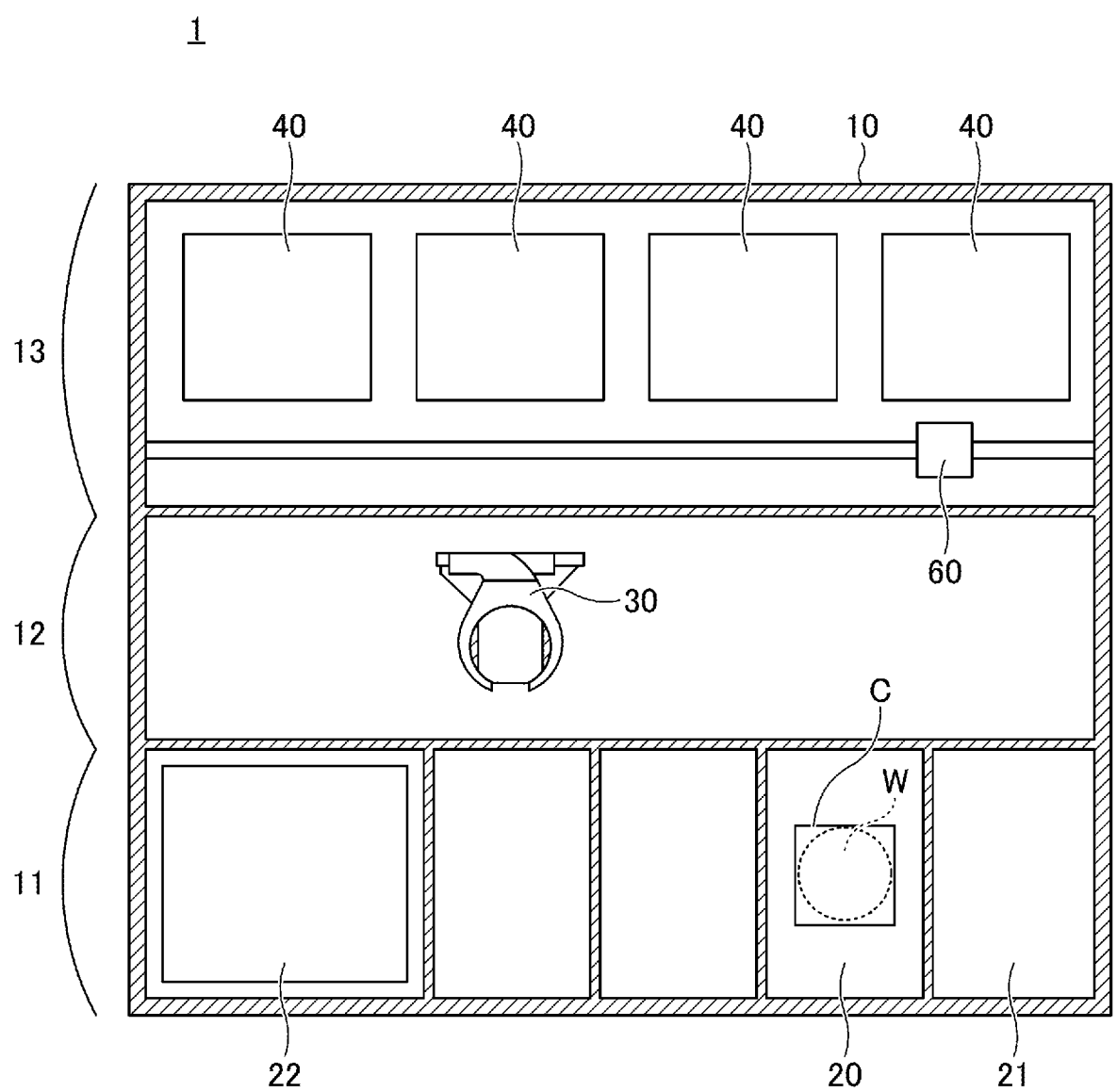
FIG. 1 is a top cross sectional view illustrating a general configuration of an inspection system according to the present embodiment.

Hereinafter, embodiments for carrying out the present disclosure will be described with reference to the drawings. In the present specification and drawings, substantially the same constituent elements are designated by the same reference numerals, and a repeated description thereof will be omitted.

<Overall Configuration of Inspection System>

Figure 2:
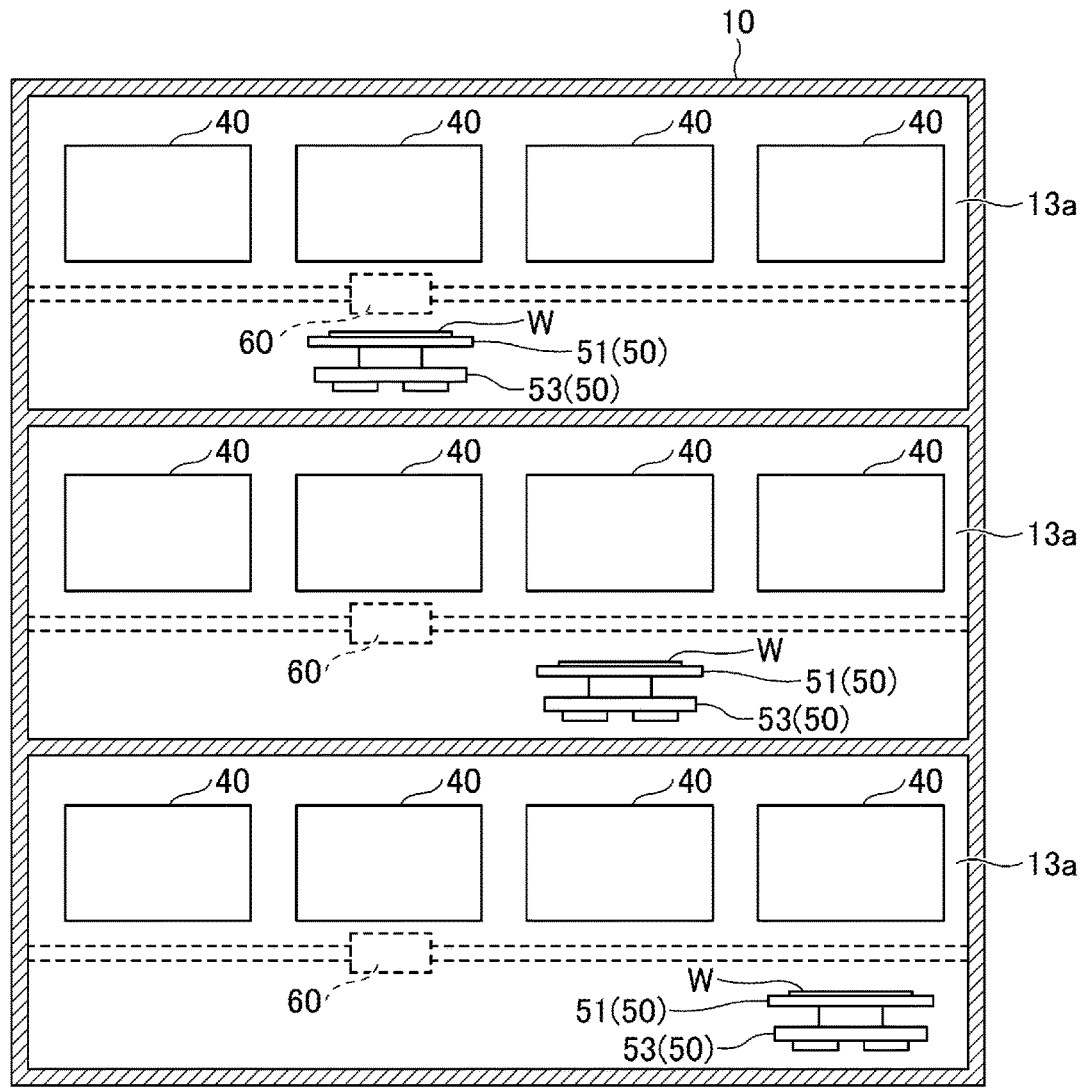
FIG. 2 is a front cross sectional view illustrating the general configuration of the inspection system according to the present embodiment.

FIG. 1 is a top cross sectional view illustrating a general configuration of an inspection system 1 according to the present embodiment. FIG. 2 is a front cross sectional view illustrating the general configuration of the inspection system 1 according to the present embodiment.

The inspection system 1 is an example of an apparatus which performs an inspection of electric characteristics based on a set temperature that is set for each wafer W, which is an example of a substrate, and the inspection system 1 includes a housing 10. An interior of the housing 10 is divided into an import/export area 11, a transport area 12, and an inspection area 13.

The import/export area 11 is an area for importing the wafer W before inspection into the inspection system 1, and for exporting the wafer W after inspection out of the inspection system 1. In addition, the import/export area 11 is an area for importing into and exporting out of the inspection system 1, a probe card 80 which will be described later. A port 20 for receiving a cassette C accommodating a plurality of wafers W, and a loader 21 for accommodating the probe cards 80 which will be described later, are provided in the import/export area 11. Further, a controller 22 for controlling each constituent element of the inspection system 1 is provided in the import/export area 11.

The transport area 12 is an area for transporting the wafer W or the like between the import/export area 11 and the inspection area 13. A transport device 30, which is freely movable in a state holding the wafer W or the like, is disposed in the transport area 12. The transport device 30 transports the wafer W between the cassette C inside the port 20 of the import/export area 11, and an alignment device 50, to be described later, of the inspection area 13. In addition, the transport device 30 transports a probe card 80 which requires maintenance among the probe cards 80 fixed to a pogo frame 70, to be described later, in the inspection area 13, to the loader 21 of the import/export area 11. Moreover, the transport device transports a new or maintenance-subjected probe card 80 from the loader 21 to the pogo frame 70 in the inspection area 13.

The inspection area 13 is an area where the electric characteristics of electronic devices formed on the wafer W are inspected. A plurality of testers 40 serving as inspection devices are provided in the inspection area 13. More particularly, the inspection area 13 is divided into three sections along a vertical direction as illustrated in FIG. 2, and a row of four testers 40 arranged in a horizontal direction in FIG. 2 is provided in each divided area 13a. In addition, one alignment device 50 and one camera 60 are provided in each dividing area 13a. The number and arrangement of the tester 40, the alignment device 50, and the camera 60 may be selected arbitrarily. The tester 40 transmits and receives electrical signals for inspecting the electric characteristics to and from the wafer W.

The alignment device 50 includes a chuck top 51, and an aligner 53. Details of the chuck top 51 and the aligner 53 will be described later. The wafer W, which is the substrate, is placed on the alignment device 50. Further, the alignment device 50 performs an alignment of the wafer W placed thereon, and the probe card 80 disposed below the tester 40. The alignment device 50 is provided so as to be movable within an area below the tester 40 for performing the alignment.

The camera 60 captures a positional relationship of the probe card 80 disposed below the tester 40, and the wafer W placed on the alignment device 50. The camera 60 is provided so as to move horizontally to a position in front of each tester 40 in the divided area 13a in which the camera 60 is located.

In the inspection system 1 according to the present embodiment, while the transport device 30 is transporting the wafer W toward one tester 40 among the plurality of testers 40 in the divided area 13a, the other testers 40 in the divided area 13a can inspect the electric characteristics of the electronic devices formed on the other wafers W.

Figure 3:
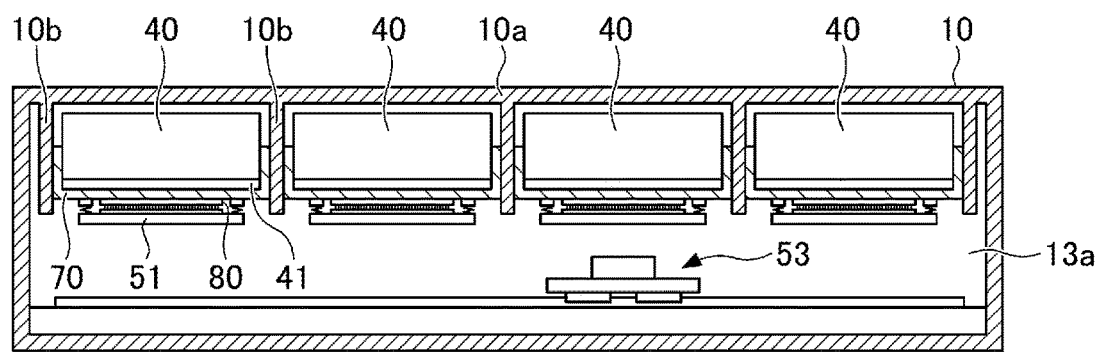
FIG. 3 is a front cross sectional view illustrating a configuration of an inspection area of the inspection system according to the present embodiment.
Figure 4:
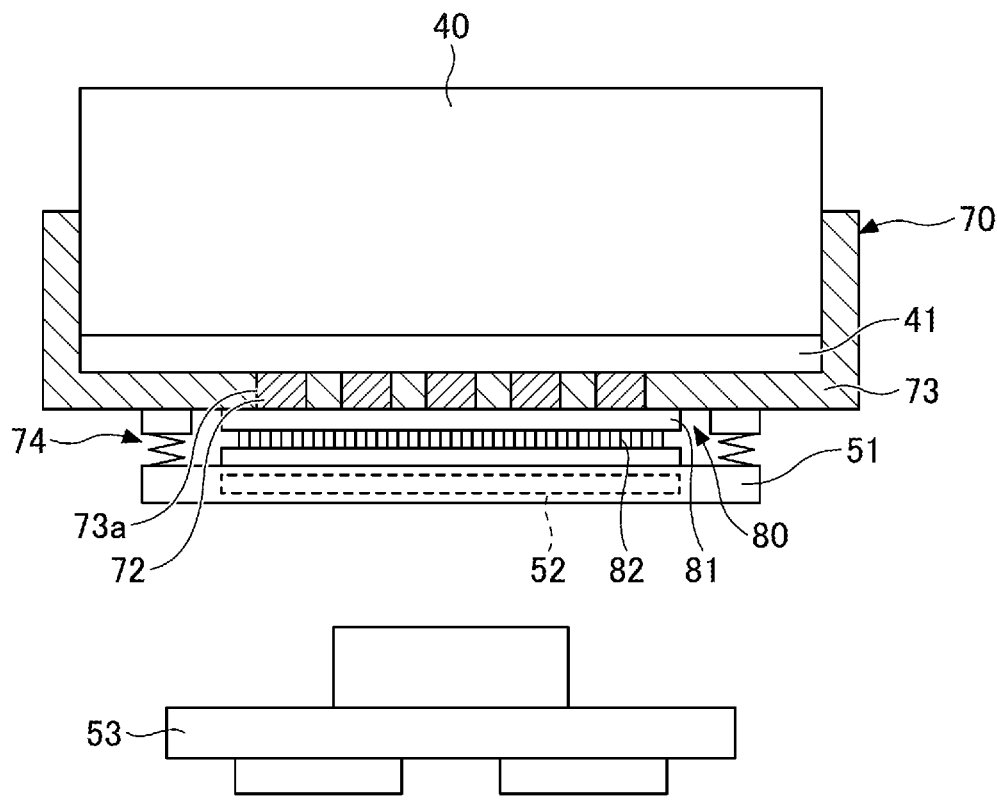
FIG. 4 is a partially enlarged view illustrating details of a tester of the inspection system according to the present embodiment.

Next, the tester 40, the alignment device 50, and configurations related thereto will be described in detail, with reference to FIG. 3 and FIG. 4. FIG. 3 is a front cross sectional view illustrating the configuration of the inspection area 13 of the inspection system 1 according to the present embodiment. FIG. 4 is a partially enlarged view illustrating details of the tester 40 of the inspection system 1 according to the present embodiment.

The tester 40 has a tester motherboard 41 that is horizontally provided at a bottom of the tester 40, as illustrated in FIG. 3 and FIG. 4. A plurality of test circuit boards, which are not illustrated, are mounted in a vertical arrangement on the tester motherboard 41. A plurality of electrodes is provided on a bottom surface of the tester motherboard 41.

Further, one pogo frame 70 and one probe card 80 are provided from the top side in this order, under the tester 40.

A plurality of support walls 10b extend downward in the vertical direction from an upper wall 10a of each dividing area 13a. Moreover, the pogo frame 70 is attached to lower portions of mutually opposing support walls 10b. Each tester 40 is supported by the mutually opposing support walls 10b, and the pogo frame 70 attached between the mutually opposing support walls 10b.

The pogo frame 70 supports the probe card 80, and electrically connects the probe card 80 and the tester 40. The pogo frame 70 is disposed at a position between tester 40 and the probe card 80. The pogo frame 70 has pogo pins that electrically connect the tester 40 and the probe card 80. More particularly, the pogo frame 70 includes a pogo block 72 which holds a large number of pogo pins, and a frame body 73 having mounting holes 73a into which the pogo pins are mounted when inserted with the pogo block 72. The frame body 73 is formed of a material having a high strength, a high rigidity, a low coefficient of thermal expansion, such as a NiFe alloy, for example. In addition, when the NiFe alloy is used, a high thermal conductivity of the frame body portion 73 can be achieved.

The probe card 80 is attached to a lower surface of the pogo frame 70 by vacuum suction in a state aligned to a predetermined position.

A bellows 74, which extends vertically downward, is attached to the lower surface of the pogo frame 70 so as to surround a mounting position of the probe card 80. The bellows 74 forms an enclosed space which includes the probe card 80 and the wafer W. Inside this enclosed space, the wafer W on a chuck top 51, which will be described later, is in a state making contact with probes 82 of the probe card 80, and the probes 82 will be described later.

In addition, a vacuum suction force from a vacuum mechanism (not illustrated) acts on the pogo frame 70 and the probe card 80. Due to this vacuum suction force, a lower end of each pogo pin of the pogo frame 70 makes contact with a corresponding electrode pad on an upper surface of a card body 81 of the probe card 80, and the card body 81 will be described later. Moreover, due to this vacuum suction force, an upper end of each pogo pin of the pogo frame 70 makes contact with a corresponding electrode on a lower surface of the tester motherboard 41.

The probe card 80 has the card body 81 having a disk shape, a plurality of electrode pads (not illustrated) provided on the upper surface of the card body 81, and the probes 82 which are a plurality of terminals having a needle-like shape and extending downward from the lower surface of the card body 81. Each electrode of the plurality of electrodes provided on the upper surface of the card body 81 is electrically connected to the corresponding probe 82. In addition, during inspection, the probes 82 make contact with electrode pads or solder bumps of the electronic devices formed on the wafer W. Accordingly, during the inspection of the electric characteristics, the electrical signals associated with the inspection are transmitted and received between the tester motherboard 41 and the electronic devices on the wafer W, via the pogo pins, the electrodes provided on the upper surface of the card body 81, and the probes 82.

The alignment device 50 includes the chuck top 51, and the aligner 53. The chuck top 51 is detachably placed on the aligner 53. The wafer W is placed on the chuck top 51. In addition, the chuck top 51 holds the wafer W placed thereon by suction. The chuck top 51 is provided with a temperature adjustment mechanism 52. This temperature adjustment mechanism 52 performs a temperature adjustment of the chuck top 51 during the inspection of the electric characteristics. By performing the temperature adjustment by the temperature adjustment mechanism 52, a temperature of the wafer W placed on the chuck top 51 during the inspection of the electric characteristics can be adjusted to −30° C. to +130° C., for example.

Moreover, the aligner 53 supports the chuck top 51, and moves the chuck top 51 in an up-down direction in FIG. 3 and FIG. 4, and in a front-rear direction and a left-right direction on the paper surface in FIG. 3 and FIG. 4.

This alignment device 50 aligns the wafer W on the chuck top 51 in a state making contact with the probes 82 of the probe card 80. In addition, after this alignment, the enclosed space including the probe card 80 and the wafer W is formed, and the enclosed space is depressurized to a vacuum by a vacuum mechanism (not illustrated). By moving the aligner 53 downward in this state, the chuck top 51 becomes disconnected from the aligner 53, and is sucked toward the pogo frame 70.

<Chuck Top>

Figure 5:
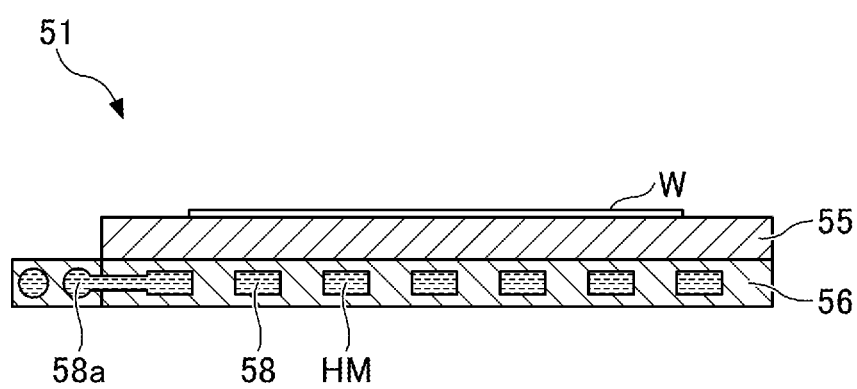
FIG. 5 is a cross sectional view illustrating details of a chuck top of the inspection system according to the present embodiment.

Next, the chuck top 51 of the inspection system 1 according to the present embodiment will be described. FIG. 5 is a cross sectional view illustrating the details of the chuck top 51 of the inspection system 1 according to the present embodiment. FIG. 5 is a diagram illustrating a state where the wafer W is placed on the chuck top 51.

The chuck top 51 of the inspection system 1 according to the present embodiment includes a top plate 55, and a cooling jacket 56. The cooling jacket 56 of the chuck top 51 according to the present embodiment is an example of a temperature adjustment mechanism 52.

The top plate 55 is a member on which the wafer W is placed. The top plate 55 is provided with a mechanism for holding the wafer W on the top plate 55 by suction.

The cooling jacket 56 is a member for adjusting the temperature of the wafer W. A heating medium flow passage 58, through which a heating medium HM flows, is provided inside the cooling jacket 56. The heating medium flow passage 58 is formed spirally in a top view, for example. The shape of the heating medium flow passage 58 in the top view is not limited to the spiral shape, and may be a zigzag shape, for example. The heating medium introduced into the heating medium flow passage 58 connects to a high-temperature chill unit ChilH and a low-temperature chill unit ChilL which will be described later, from an inlet and outlet pipe 58a provided outside the cooling jacket 56. A heater may be provided separately as a member for adjusting the temperature. The heating medium HM is a medium for adjusting the temperature of the wafer W. The heating medium HM may be water, brine, or the like, for example. The heating medium HM may be used to cool the wafer W, or to heat the wafer W.

Figure 6:
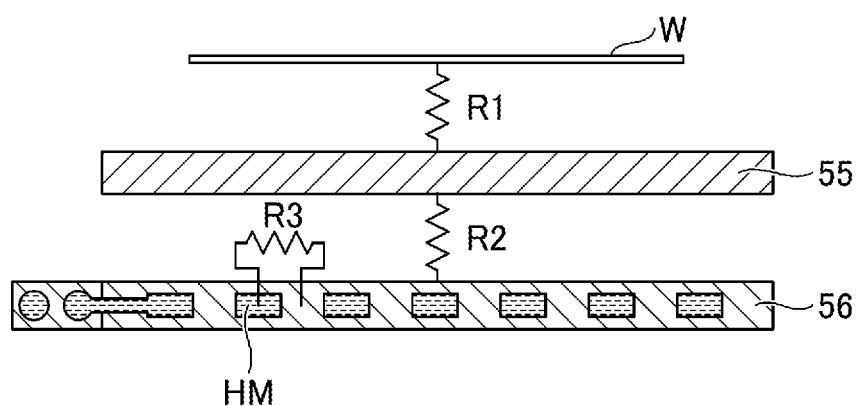
FIG. 6 is a diagram for explaining a thermal relationship of the chuck top of the inspection system according to the present embodiment.

A thermal relationship will be described with respect to the chuck top 51 of the inspection system 1 according to the present embodiment. FIG. 6 is a diagram for explaining the thermal relationship of the chuck top 51 of the inspection system 1 according to the present embodiment. A thermal resistance (hereinafter referred to as a "thermal resistance R1") is present between the wafer W and the top plate 55. For this reason, when the wafer W generates heat, for example, the temperature of the wafer W deviates from the temperature of the top plate 55. Similarly, a thermal resistance (hereinafter referred to as a "thermal resistance R2") is present between the top plate 55 and the cooling jacket 56. In addition, a thermal resistance (hereinafter referred to as a "thermal resistance R3") is present between the cooling jacket 56 and the heating medium HM. Thus, the thermal resistances R1, R2, and R3 are present between the members forming the chuck top 51.

Because the top plate 55 and cooling jacket 56 do not have a heat source, the temperatures of the top plate 55 and the cooling jacket 56 vary by following the temperature of the heating medium HM. Hence, by adjusting the temperature of the heating medium HM, the temperatures of the top plate 55 and the cooling jacket 56 can be maintained at the temperature of the heating medium HM. However, when heat is generated from the wafer W, a temperature difference (deviation) occurs between the wafer W and the top plate 55 because the thermal resistance R1 is present between the wafer W and the top plate 55. Accordingly, the temperature of the wafer W becomes higher than the temperature of the heating medium HM even if the temperature of the heating medium HM is controlled, and the temperature of the wafer W becomes higher than a set temperature even if the top plate 55 and the cooling jacket 56 are maintained at the set temperature. In the inspection system 1 according to the present embodiment, the thermal resistance R1 between the wafer W and the top plate 55 is canceled, by measuring a heating value Qw of the wafer W and performing a correction based on the heating value Qw. Thus, a temperature control is performed so that the temperature of the wafer W becomes the set temperature. The chuck top 51 is an example of a stage.

<Temperature Control of Heating Medium>

Figure 7:
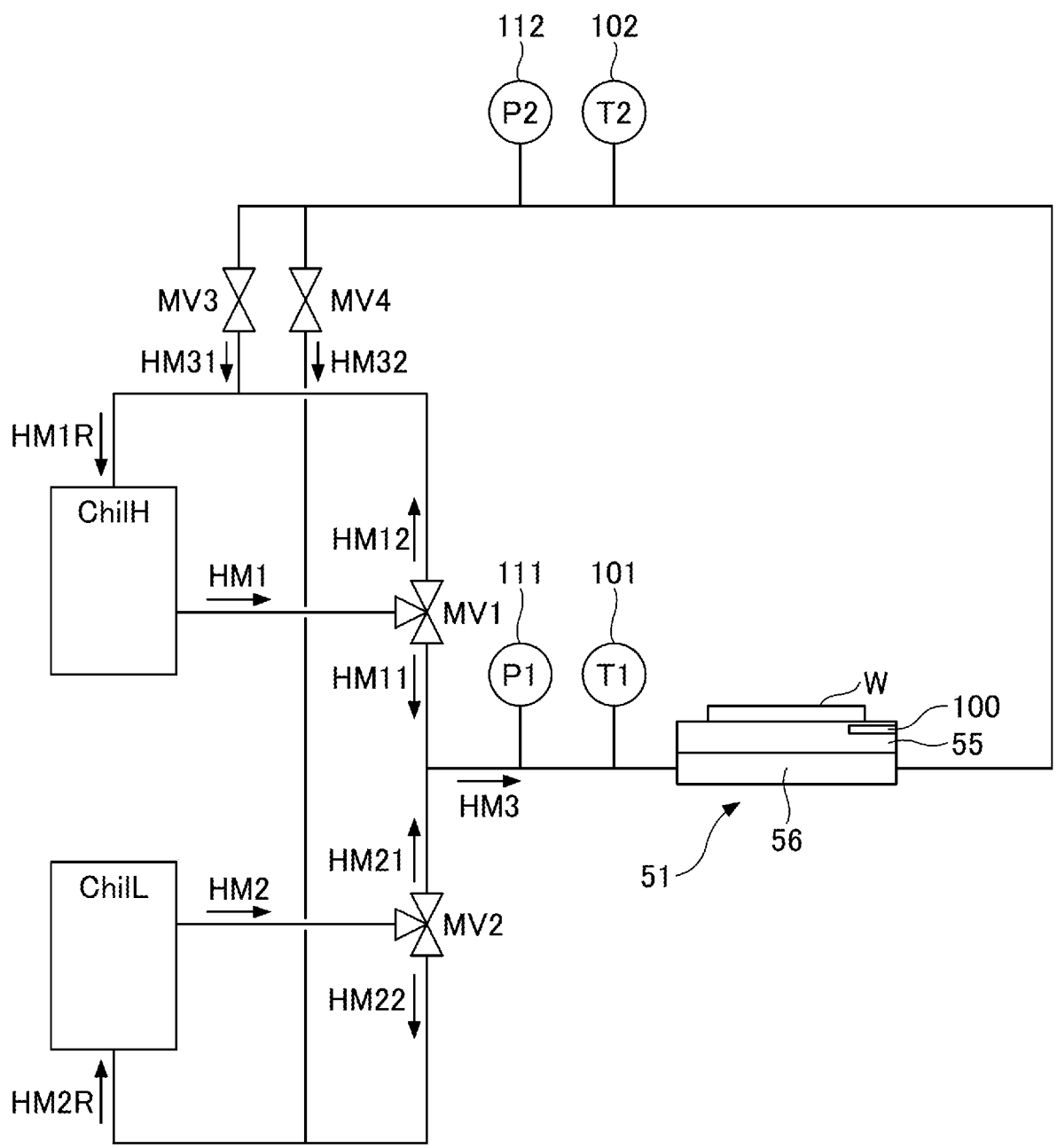
FIG. 7 is a diagram for explaining a flow passage of a heating medium of an inspection system according to the present embodiment.

Next, the temperature control of the heating medium HM will be described. FIG. 7 is a diagram for explaining a flow passage of the heating medium HM of the inspection system 1 according to the present embodiment. In the following description, with respect to heating medium HM, heating media having different temperatures or different flow passages will be described by designating different reference numerals thereto.

The inspection system 1 according to the present embodiment includes the high-temperature chiller unit ChilH, the low-temperature chiller unit ChilL, three-way valves MV1 and MV2, and control valves MV3 and MV4.

The high-temperature chiller unit ChilH supplies the heating medium HM (heating medium HM1) having a temperature Tch. The low-temperature chiller unit ChilL supplies the heating medium HM (heating medium HM2) having a temperature Tcl which is lower than the temperature Tch. The high-temperature chiller unit ChilH is an example of a first chiller unit which supplies a first heating medium controlled to a first temperature, and the low-temperature chiller unit ChilL is an example of a second chiller unit which supplies a second heating medium controlled to a second temperature which is lower than the first temperature. In addition, the heating medium HM1 is an example of the first heating medium, and the heating medium HM2 is an example of the second heating medium. Further, the temperature Tch is an example of the first temperature, and the temperature Tcl is an example of the second temperature.

Each of the three-way valves MV1 and MV2 is a valve which distributes the heating medium HM1 or the heating medium HM2 flowing to one inlet to two flow passages to flow thereto. The three-way valves MV1 and MV2 include electric or pneumatic drivers. These drivers vary valve positions of the three-way valves MV1 and MV2 according to external control signals. By varying the valve positions, the heating media HM1 and HM2 flowing into the three-way valves MV1 and MV2 are distributed according to the valve positions to flow out to the two flow passages.

The control valves MV3 and MV4 are on-off valves which control the flow rate according to the valve position. The control valves MV3 and MV4 may be formed by gate valves, ball valves, or the like, for example. The control valves MV3 and MV4 include electric or pneumatic drivers. These drivers vary the valve positions of the control valves MV3 and MV4 according to external control signals. By varying the valve position, the flow rate of a heating medium HM31 or a heating medium HM32 flowing out of each of the control valves MV3 and MV4 is determined according to the valve position.

In addition, the inspection system 1 according to the present embodiment includes temperature sensors 100, 101, and 102, and pressure detectors 111 and 112.

The temperature sensors 100, 101, and 102 are devices for sensing the temperature, such as resistance thermometer sensors, thermocouples, thermistors, or the like, for example. The temperature sensor 100 is provided on the top plate 55 of chuck top 51, and measures the temperature of top plate 55. The temperature sensor 101 is provided in the flow passage of the heating medium HM3 flowing into the chuck top 51, and measures the temperature (inlet temperature) of the heating medium HM3 flowing into the chuck top 51. The temperature sensor 102 is provided in the flow passage of the heating medium HM3 flowing out of the chuck top 51, and measures the temperature (outlet temperature) of the heating medium HM3 discharged from the chuck top 51. Because the temperature sensor 101 and the temperature sensor 102 measure the temperature difference between the heating medium HM3 flowing into the chuck top 51 and the heating medium HM3 flowing out of the chuck top 51, the temperature sensor 101 and the temperature sensor 102 are desirably provided near the chuck top 51.

The pressure detectors 111 and 112 are devices for detecting the pressure. The pressure detector 111 is provided in the flow passage of the heating medium HM3 flowing into the chuck top 51, and measures the pressure (inlet pressure) of the heating medium HM3 flowing into the chuck top 51. The pressure detector 112 is provided in the flow passage of the heating medium HM3 flowing out of the chuck top 51, and measures the pressure (outlet pressure) of the heating medium HM3 discharged from the chuck top 51. Because the pressure detector 111 and the pressure detector 112 measure the pressure difference between the heating medium HM3 flowing into the chuck top 51 and the heating medium HM3 flowing out of the chuck top 51, the pressure detector 111 and the pressure detector 112 desirably provided near the chuck top 51.

The flow passage of the heating medium HM will be described. The heating medium HM1 having the temperature Tch and supplied from the high-temperature chiller unit ChilH flows into the three-way valve MV1. In the three-way valve MV1, a heating medium HM11, which is a portion of the supplied heating medium HM1, is diverted to a flow passage toward the cooling jacket 56, and a remaining heating medium HM12 is diverted to a flow passage fed back to the high-temperature chiller unit ChilH, based on the control signal. Hence, the three-way valve MV1 flows a portion of the supplied heating medium HM1 to the flow passage toward the cooling jacket 56. Similarly, the heating medium HM2 having the temperature Tcl and supplied from the low-temperature chiller unit ChilL flows into the three-way valve MV2. In the three-way valve MV2, a heating medium HM21, which is a portion of the supplied heating medium HM2, is diverted into a flow passage toward the cooling jacket 56, and a remaining heating medium HM22 is diverted to a flow passage fed back to the low-temperature chiller unit ChilL, based on the control signal. Hence, the three-way valve MV2 flows a portion of the supplied heating medium HM2 to the flow passage toward the cooling jacket 56. The heating media HM11 and HM21, diverted toward the cooling jacket 56 by the three-way valve MV1 and the three-way valve MV2, are mixed by merging halfway toward the cooling jacket 56. The heating medium, obtained by mixing the diverted heating medium HM11 and heating medium HM21, will be referred to as a heating medium HM3. A temperature T1 of the heating medium HM3 is determined by the temperature and the flow rate of each of the heating medium HM11 supplied from the high-temperature chiller unit ChilH through the three-way valve MV1, and the heating medium HM21 supplied from the low-temperature chiller unit ChilL through the three-way valve MV2. The temperature T1 is measured by the temperature sensor 101. A pressure P1 of the heating medium HM3 is measured by the pressure detector 111.

As described above, in order to dynamically vary the temperature T1 of the heating medium HM3, the heating media HM of two systems, namely, the high-temperature heating medium HM11 (heating medium HM1) and the low-temperature heating medium HM21 (heating medium HM2), are mixed. By mixing the heating media HM of the two systems in this manner, the temperature of the heating medium HM3 can be quickly varied to stabilize at a predetermined temperature.

The heating medium HM3 in which the heating medium HM11 and the heating medium HM21 are mixed, passes through the cooling jacket 56. As the heating medium HM3 passes through the cooling jacket 56, the temperature of the wafer W is adjusted through the top plate 55. The temperature T2 and the pressure P2 of the heating medium HM3 flowing out of the cooling jacket 56 are measured by the temperature sensor 102 and the pressure detector 112, respectively. Further, the heating medium HM3 flowing out of the cooling jacket 56 flows into the control valves MV3 and MV4. The control valve MV3 flows the heating medium HM31, having the same flow rate as the heating medium HM11 flowing from the three-way valve MV1 to the cooling jacket 56, to the flow passage fed back to the high-temperature chiller unit ChilH. The heating medium HM31 flowing from the control valve MV3 is mixed with the heating medium HM12 fed back from the three-way valve MV1 to the high-temperature chiller unit ChilH, and (heating medium HM1R) is fed back to the high-temperature chiller unit ChilH. The control valve MV4 flows the heating medium HM32, having the same flow rate as the heating medium HM21 flowing from the three-way valve MV2 to the cooling jacket 56, to the flow passage fed back to the low-temperature chiller unit ChilL. The heating medium HM32 flowing from the control valve MV4 is mixed with the heating medium HM22 fed back to the low-temperature chiller unit ChilL, and (heating medium HM2R) is fed back to the low-temperature chiller unit ChilL.

The heating medium HM3 is an example of a heating medium in which the first heating medium and the second heating medium are mixed at a desired mixing ratio. The three-way valve MV1 (first three-way valve) and the three-way valve MV2 (second three-way valve) are examples of a valve at an output of the first chiller unit, and a value at an output of the second chiller unit.

<Controller>

Figure 8:
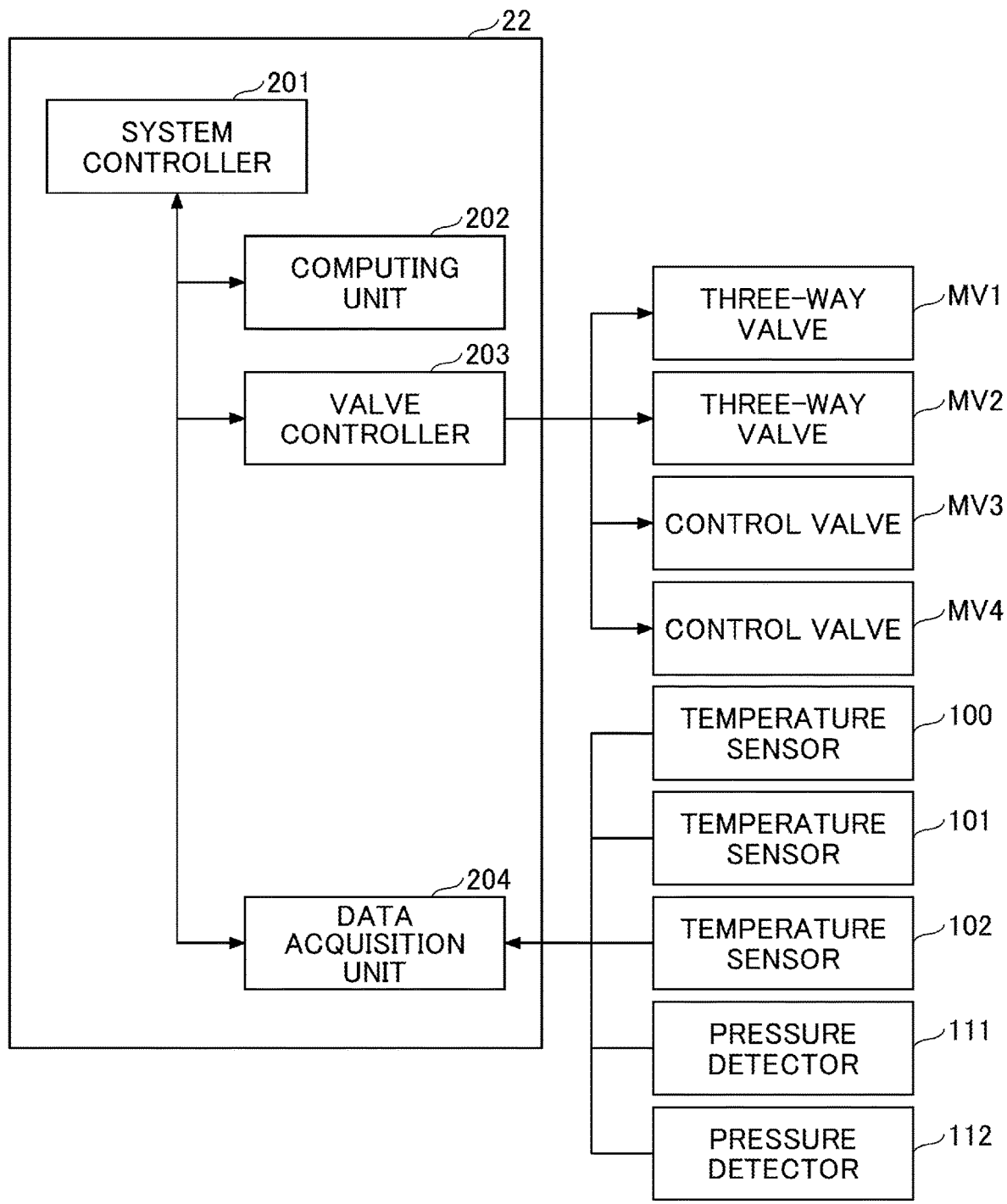
FIG. 8 is a functional block diagram of the inspection system according to the present embodiment.

Next, the controller 22 for performing the temperature control will be described. FIG. 8 is a functional block diagram of a portion, related to the temperature control, of the inspection system 1 according to the present embodiment.

The controller 22 includes a system controller 201, a computing unit 202, a valve controller 203, and a data acquisition unit 204. The controller 22 includes a storage device which stores a readable program, and a central processing unit (CPU) or the like which executes the program. The controller 22 operates as a computer.

The system controller 201 performs a control of the entire controller 22.

The computing unit 202 performs a computation using the data acquired by the data acquisition unit 204, to compute the temperature difference, the flow rate, the heating value, a correction value, the mixing ratio, the valve position, or the like which will be described later.

The valve controller 203 transmits the control signals to the three-way valves MV1 and MV2, and the control valves MV3 and MV4, to control the valve position or the like of each valve. Hence, the amount of the heating medium HM flowing from each valve is controlled.

The data acquisition unit 204 acquires the data of the temperature and the pressure from the temperature sensors 100, 101, and 102 and the pressure detectors 111 and 112, respectively.

<Wafer Temperature Control Method>

Figure 9:
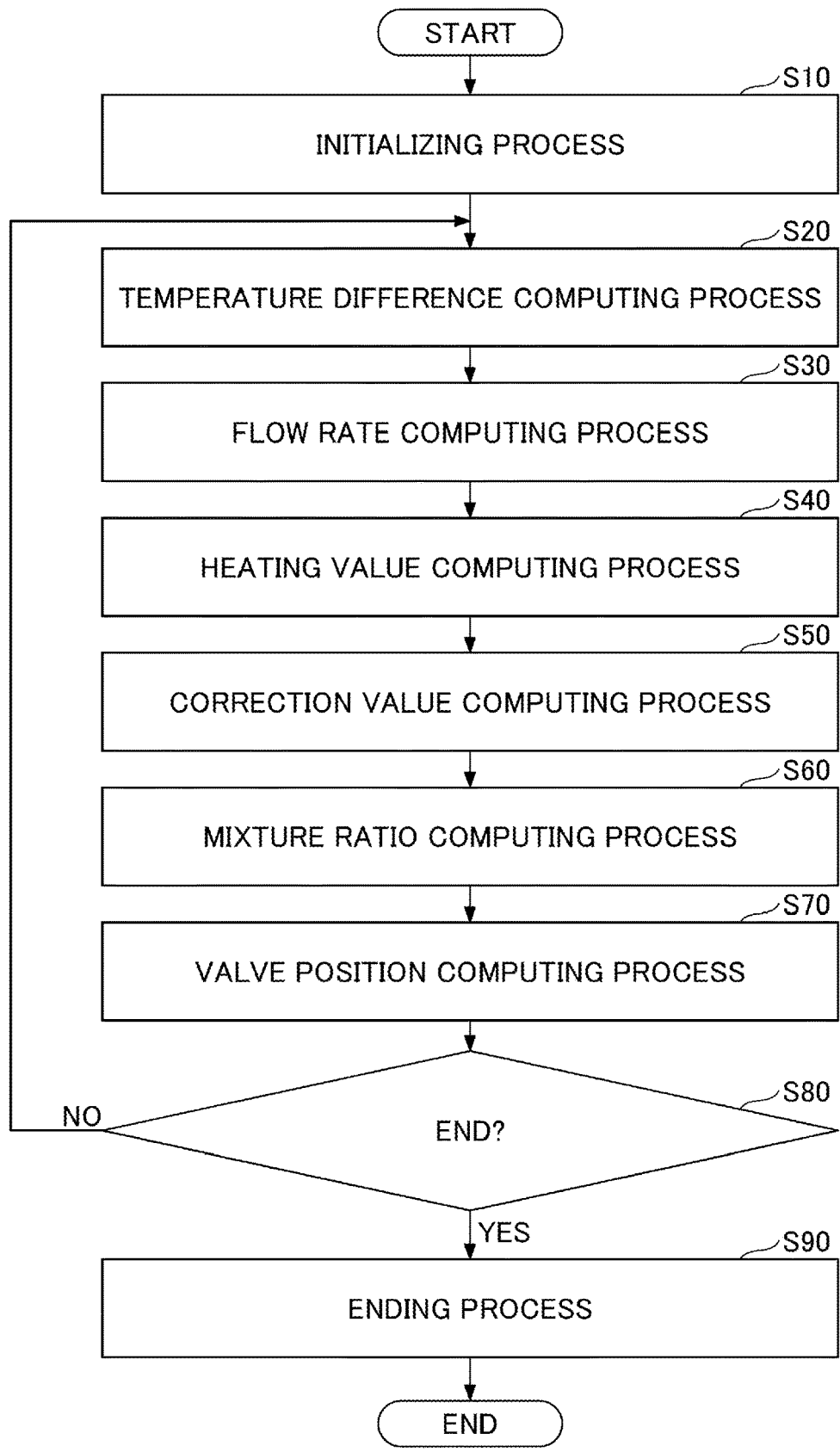
FIG. 9 is a flow chart for explaining processes of the inspection system according to the present embodiment.

Next, processes of the inspection system 1 according to the present embodiment will be described. FIG. 9 is a flow chart for explaining the processes of the inspection system 1 according to the present embodiment. The inspection system 1 performs the processes based on the following steps (procedures). In the inspection system 1 according to the present embodiment, electrical tests or the like on the wafer W are performed while performing the processes illustrated in FIG. 9.

(Step S10) When an operation of the inspection system 1 is started (for example, an inspection process starts or the like), the controller 22 performs an initializing process to initialize the inspection system 1. In the initializing process, an initialization of each functional part of the controller 22 is performed, for example.

(Step S20) The data acquisition unit 204 acquires the temperature T1 from the temperature sensor 101. In addition, the data acquisition unit 204 acquires the temperature T2 from the temperature sensor 102. The computing unit 202 determines a temperature difference $\Delta T$ based on a difference between the temperature T1 and the temperature T2 acquired by the data acquisition unit 204, based on Formula 1. A temperature Ta refers to a temperature difference between the temperature T1 and the temperature T2 when the wafer W is not generating heat. This temperature Ta is caused by a temperature rise due to heat generated by a pipe resistance between the temperature sensor 101 and the temperature sensor 102, or the like.

$$\Delta T = T2 - T1 - Ta \quad \text{[Formula 1]}$$

(Step S30) The data acquisition unit 204 acquires the pressure P1 from the pressure detector 111. In addition, the data acquisition unit 204 acquires the pressure P2 from the pressure detector 112. The computing unit 202 determines a pressure difference $\Delta P$ of the pressure P1 and the pressure P2 acquired by the data acquisition unit 204, based on Formula 2. The determined pressure difference $\Delta P$ is used to determine a flow rate Q of the heating medium HM (heating medium HM3) flowing through the cooling jacket 56, based on Formula 3. Here, K1 denotes a constant determined from a structure of the cooling jacket 56 or the like.

$$\Delta P = P1 - P2 \quad \text{[Formula 2]}$$

$$Q = K1 \times \Delta P \quad \text{[Formula 3]}$$

The inspection system 1 according to the present embodiment determines the flow rate Q of the heating medium HM (heating medium HM3) from the pressure difference $\Delta P$, but the flow rate Q may be determined using other means. For example, a flow meter, such as an electromagnetic flow meter, an impeller flow meter, a Coriolis flow meter, an ultrasonic flow meter, or the like, may be used. In addition, an orifice or the like may be provided in the flow passage of the heating medium, to measure the flow rate from a differential pressure.

(Step S40) The computing unit 202 estimates a heating value Qw of the wafer W from the determined temperature difference $\Delta T$ and flow rate Q, based on Formula 4. Here, K2 denotes a constant determined from the thermal resistance R1 or the like.

$$Qw = K2 \times \Delta T \times Q \quad \text{[Formula 4]}$$

(Step S50) The computing unit 202 determines a correction value Tcor for controlling the temperature of the wafer W from the determined heating value Qw of the wafer W, based on Formula 5. Here, K3 denotes a constant determined from thermal resistance R1 or the like.

$$Tcor = K3 \times Qw \quad \text{[Formula 5]}$$

As described above, when wafer W generates heat, the temperature of wafer W deviates from a target temperature Tw due to the thermal resistance R1 between wafer W and top plate 55, even if the temperature of top plate 55 is set to the target temperature Tw of wafer W. Hence, in the inspection system 1 according to the present embodiment, the temperature of the top plate 55 is controlled by offsetting the temperature of the top plate 55 from the target temperature Tw of the wafer W by the correction value Tcor. In other words, when controlling the temperature of the wafer W to the target temperature Tw, the temperature of the top plate 55 is set to a target temperature Ttp represented by Formula 6. When setting the temperature of the top plate 55 to the target temperature Ttp, the temperature of the heating medium HM3 supplied to the chuck top 51 (cooling jacket 56) is set to the target temperature Ttp.

$$Ttp = Tw - Tcor \quad \text{[Formula 6]}$$

The target temperature Ttp may be modified according to the heating value Qw of the wafer W. For example, when the heating value Qw is small (when the heating value Qw is smaller than a set threshold value (less than or equal to the threshold value)), the target temperature Ttp may be the target temperature Tw of the wafer W. In this case, when the heating value Qw is large (when the heating value Qw is greater than the set threshold value (greater than or equal to the threshold value)), the target value Ttp is corrected using the correction value Tcor.

(Step S60) The computing unit 202 determines a mixing ratio Chm of the heating medium HM1 (temperature Tch) supplied from the high-temperature chiller unit ChilH, and the heating medium HM2 (temperature Tcl) supplied from the low-temperature chiller unit ChilL. The computing unit 202 determines the mixing ratio Chm based on Formula 7, so that a temperature of the heating medium HM3, which is a mixture of the heating medium HM1 and the heating medium HM2, becomes the target temperature Ttp. In the inspection system 1 according to the present embodiment, the mixing ratio was determined as a ratio of the heating medium HM1 with respect to the flow rate of the heating medium HM3. A flow rate Qh represents a flow rate at which the heating medium HM (temperature Tch) supplied from the high-temperature chiller unit ChilH, and a flow rate Ql represents a flow rate at which the heating medium HM (temperature Tcl) supplied from the low-temperature chiller unit ChilL is mixed.

$$Chm=Qh/(Ql+Qh)=(Ttp-Tcl)/(Tch-Tcl) \qquad \text{[Formula 7]}$$

Thus, the heating value Qw of the wafer W is determined based on the difference between the temperature T1 and the temperature T2, and the flow rate Q. Then, the mixing ratio Chm is determined from the target temperature Ttp which is corrected by the correction value TCOR based on the heating value Qw of the wafer W. Accordingly, the mixing ratio Chm can be corrected based on the difference between the temperature T1 and the temperature T2, and the flow rate Q.

In the present embodiment, the heating value Qw of the wafer W is determined, however, the mixing ratio Chm may be corrected based on the difference between the temperature T1 and the temperature T2, and the flow rate Q. For example, a table which can directly correct the mixing ratio Chm from the difference between the temperature T1 and the temperature T2, and the flow rate Q, may be prepared in advance, and the mixing ratio Chm may be determined using this table.

As described above, the controller 22 controls the process of measuring the temperature T1 and the temperature T2 in step S20. In addition, the controller 22 controls the process of measuring the pressure P1 and the pressure P2 in step S30. Further, the controller 22 controls the process of correcting the mixing ratio Chm in steps S20, S30, S40, S50, and S60.

(Step S70) The computing unit 202 determines the valve positions of the three-way valve MV1 and the three-way valve MV2, so that the mixing ratio becomes the determined mixing ratio Chm. In addition, the valve controller 203 controls the valve positions of the three-way valves MV1 and MV2, using the determined valve positions. Moreover, the valve positions of the control valves MV3 and MV4 are controlled in accordance with the above.

(Step S80) The controller 22 determines whether or not to end the process. When ending the process (step S80: YES), the process advances to step S90. When not ending the process (step S80: NO), the process returns to step S20 to repeat the process from step S20.

(Step S90) A process performed to end the process of the inspection system 1.

<Operation of Inspection System>

Figure 10:
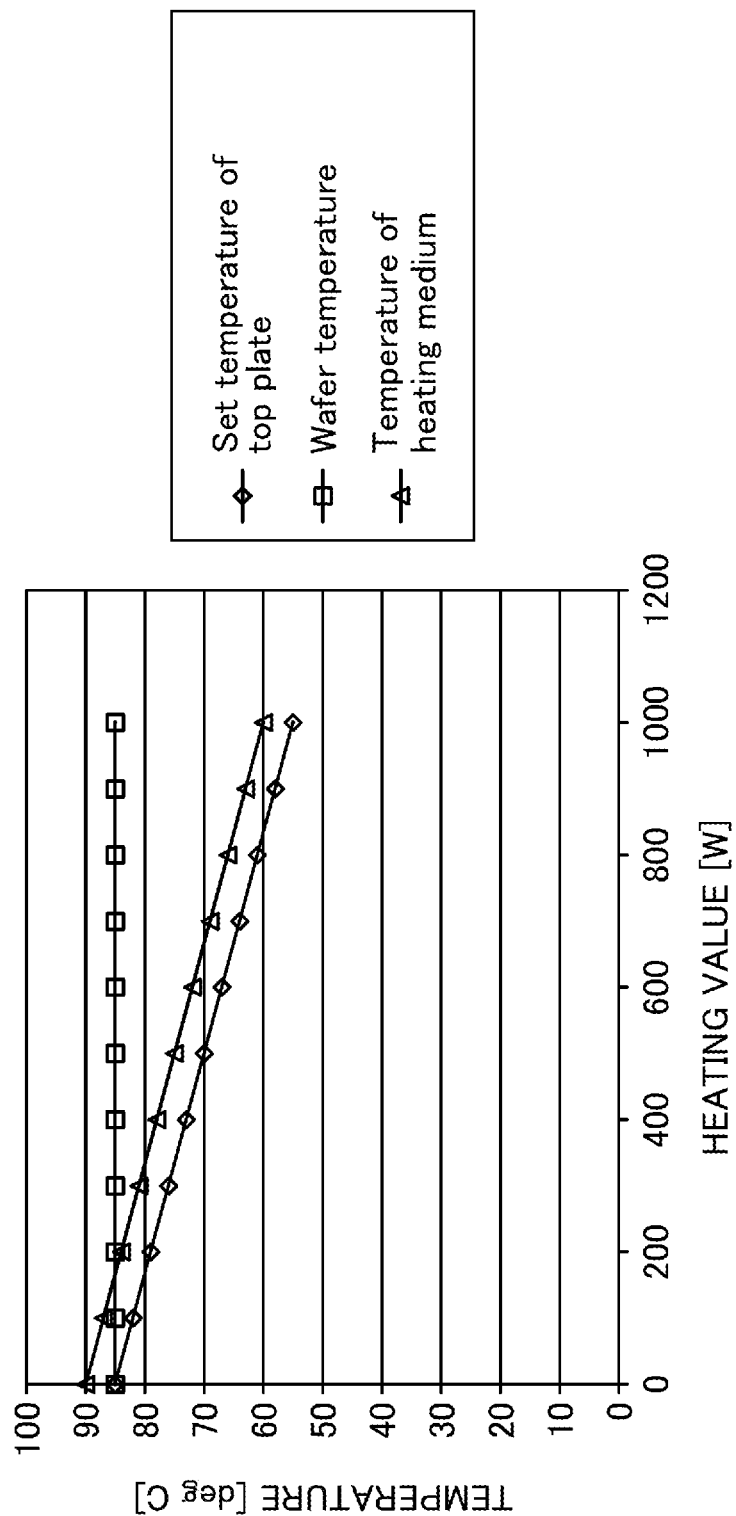
FIG. 10 is a diagram for explaining a temperature upon operation of the inspection system according to the present embodiment.
Figure 11:
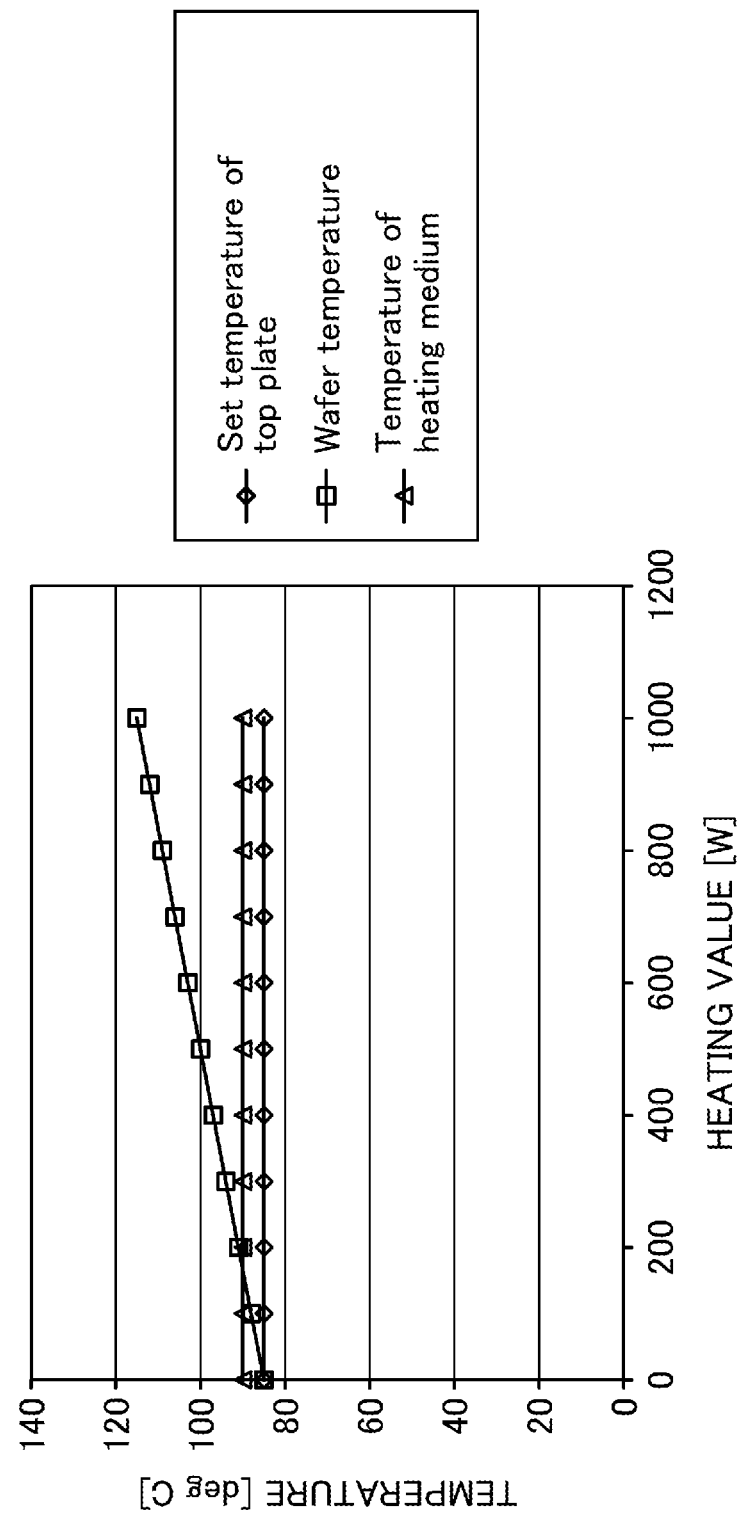
FIG. 11 is a diagram for explaining the temperature upon operation of an inspection system according to a comparative example.

The operation of the inspection system 1 according to the present embodiment will be described. FIG. 10 is a diagram for explaining the temperature when the inspection system 1 according to the present embodiment is operated. FIG. 11 is a diagram for explaining the temperature when an inspection system according to a comparative example is operated. FIG. 10 and FIG. 11 illustrate cases where the target temperature of the wafer W is set to 85° C. In FIG. 10 and FIG. 11, the abscissa indicates the heating value Qw of the wafer W, and the ordinate indicates the temperatures of the top plate 55, the wafer W, and the heating medium HM3, respectively.

In the inspection system 1 according to the present embodiment, as illustrated in FIG. 10, the target temperature Ttp (set temperature of the top plate) for adjusting the temperature of the top plate 55 is corrected according to the heating value Qw of the wafer W which is an inspection target to be inspected. More particularly, the larger the heating value Qw of the wafer W becomes, the lower the set temperature of the top plate becomes. The temperature of the heating medium in FIG. 10 represents an outlet temperature (temperature T2) of the heating medium HM3. In a case where the wafer W is not generating heat, the temperature of the heating medium is 90° C. In other words, Ta of the Formula 1 is 5° C. The set temperature of the top plate becomes lower when the heating value Qw of the wafer W becomes larger. As a result, the temperature of the heating medium becomes low when the heating value Qw becomes large. Thus, the temperature of the wafer W remains constant regardless of the heating value Qw of the wafer W.

On the other hand, in the inspection system according to the comparative example, as illustrated in FIG. 11, the target temperature Ttp (set temperature of the top plate) for adjusting the temperature of the top plate 55 is set constant regardless of the heating value Qw of the wafer W. For this reason, the temperature of the heating medium becomes constant. The temperature of the heating medium in FIG. 11 represents the outlet temperature (temperature T2) of the heating medium HM3. However, the temperature of the wafer W is high due to the temperature difference between the top plate 55 and the wafer W caused by the heating value Qw of the wafer W. As described above, the temperature of the wafer W becomes higher than the set temperature of the top plate due to the heat generated from the wafer W, and cannot be controlled to the target temperature of the wafer W.

The temperature sensor 101 is an example of a sensor which measures the temperature of the heating medium at the inlet of the flow passage. The temperature sensor 102 is an example of a sensor which measures the temperature of the heating medium at the outlet of the flow passage. In addition, the pressure detector 111 is an example of a detector which measures the pressure of the heating medium at the inlet of the flow passage. The pressure detector 112 is an example of a detector which measures the pressure of the heating medium at the outlet of the flow passage.

Functions and Effects

Because the inspection system 1 according to the present embodiment corrects the target temperature for adjusting the temperature of the top plate 55 according to the heat generated from the wafer W (substrate), an inspection can be performed based on the set temperature that is set for each substrate, regardless of the heat generated from the wafer W (substrate). Accordingly, it is possible to adjust the temperature of the substrate according to the thermal resistance between the substrate and the flow passage.

In addition, the temperature of the cooling jacket 56 is adjusted, by supplying the heating medium having a constant temperature from the high-temperature chiller unit ChilH and the heating medium having a constant temperature from the low-temperature chiller unit ChilL, and mixing these heating media. By mixing the heating media in this manner, it is possible to dynamically vary the temperature of the heating medium HM. Moreover, by mixing the heating media, it is possible to vary the temperature with a quick response. By quickly varying the temperature, it is possible to reduce the inspection time.

Further, by computing the heating value Qw of the wafer W using the measurement results of the temperature sensors and the pressure detectors in the flow passage of the heating medium HM, it is possible to perform a correction without directly measuring the temperature of the wafer W. For example, in order to detect the temperature of the wafer W which is being inspected, it is necessary to obtain information from the tester 40. In this case, the process must be performed depending on the tester 40. Because it is unnecessary to obtain information from the tester 40 in the inspection system 1 according to the present embodiment, the process can be performed without depending on the tester 40.

In the present embodiment, the three-way valves MV1 and MV2 are used, however, these three-way valves may be on-off valves, similar to the control valves MV3 and MV4. In this case, the flow passage from the three-way valves MV1 and MV2 to a merging point at the downstream side of the control valves MV3 and MV4 becomes unnecessary, thereby enabling the pipe arrangement to be simplified.

<First Modification>

Figure 12:
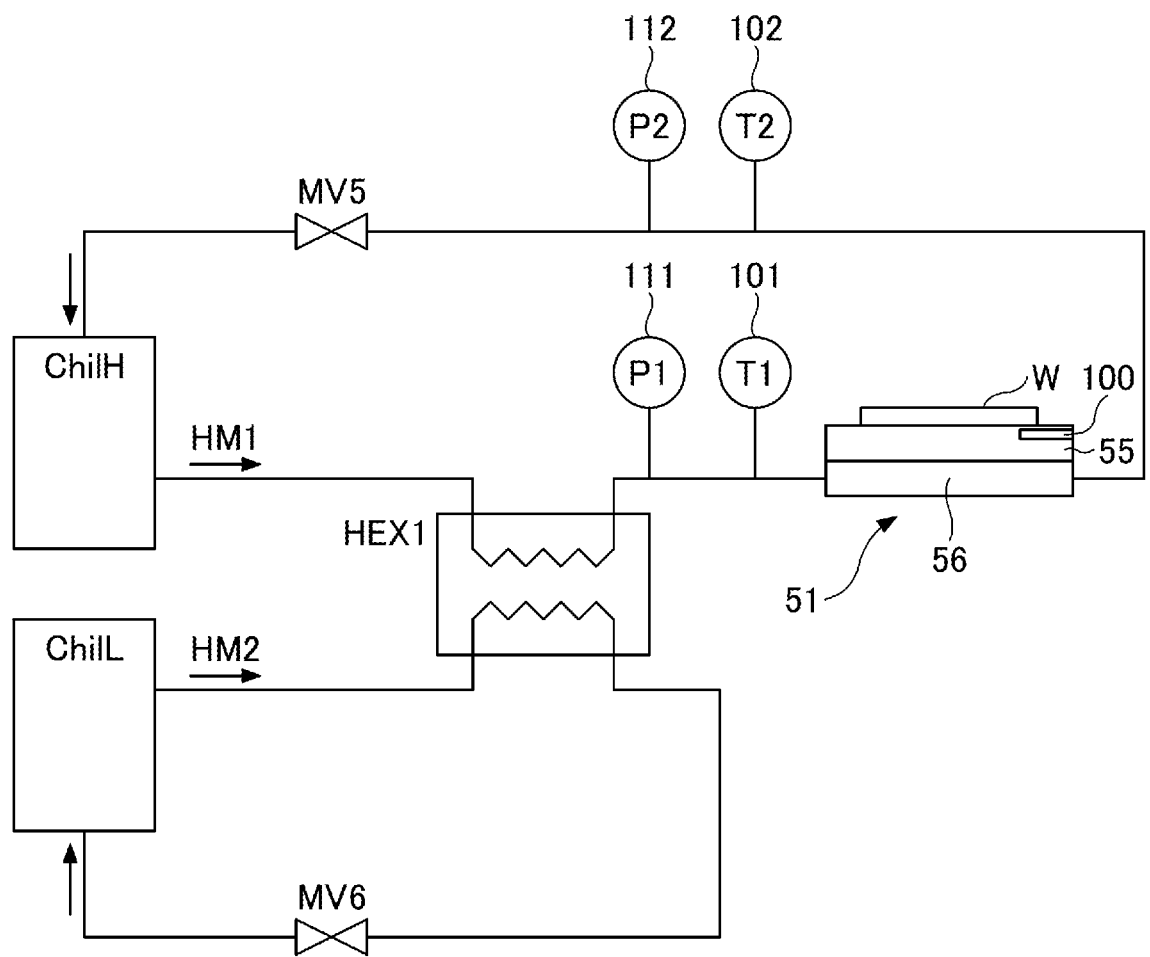
FIG. 12 is a diagram for explaining the flow passage of the heating medium of the inspection system according to a modification of the present embodiment.

An example in which the flow passage of the inspection system 1 according to the present embodiment is modified, is illustrated. FIG. 12 is a diagram for explaining the flow passage of the heating medium according to a first modification of the inspection system according to the present embodiment.

The flow passage of the heating medium HM according to the first modification will be described. The heating medium HM1 supplied from the high-temperature chiller unit ChilH and having the temperature Tch flows into a heat exchanger HEX1. Similarly, the heating medium HM2 supplied from the low-temperature chiller unit ChilL and having the temperature Tcl flows into the heat exchanger HEX1. The flow rates of the heating medium HM1 and the heating medium HM2 are controlled by the control valves MV5 and MV6, respectively. In the heat exchanger HEX1, a heat exchange occurs between the heating medium HM1 and the heating medium HM2. As a result, the temperature of the heating medium HM1 flowing out of the heat exchanger HEX1 decreases compared to the temperature when flowing into the heat exchanger HEX1. The temperature of the heating medium HM1 flowing out of the heat exchanger HEX1 can be controlled by the flow rates of the heating medium HM1 and the heating medium HM2, respectively.

As described above, when wafer W generates heat, the temperature of wafer W deviates from the target temperature Tw even if the temperature of top plate 55 is set to the target temperature Tw of wafer W, due to the thermal resistance R1 between wafer W and top plate 55. Hence, in the inspection system 1 according to the present embodiment, the temperature of the top plate 55 is controlled by offsetting the temperature of the top plate 55 from the target temperature Tw of the wafer W by the correction value Tcor. In other words, when controlling the temperature of the wafer W to the target temperature Tw, the temperature of the top plate 55 is set to a target temperature Ttp represented by Formula 6 described above. When setting the temperature of the top plate 55 to the target temperature Ttp, the temperature of the heating medium HM3 supplied to the chuck top 51 (cooling jacket 56) is set to the target temperature Ttp. Hence, the controller 22 controls the process of correcting the target temperature.

By using the flow passage of the heating medium HM according to the first modification, the temperature of the wafer W can be adjusted without mixing the heating media HM1 and HM2 supplied from the high-temperature chiller unit ChilH and the low-temperature chiller unit ChilL, respectively. Accordingly, different heating media may be used as the heating media of the high-temperature chiller unit ChilH and the low-temperature chiller unit ChilL, for example.

<Second Modification>

Figure 13:
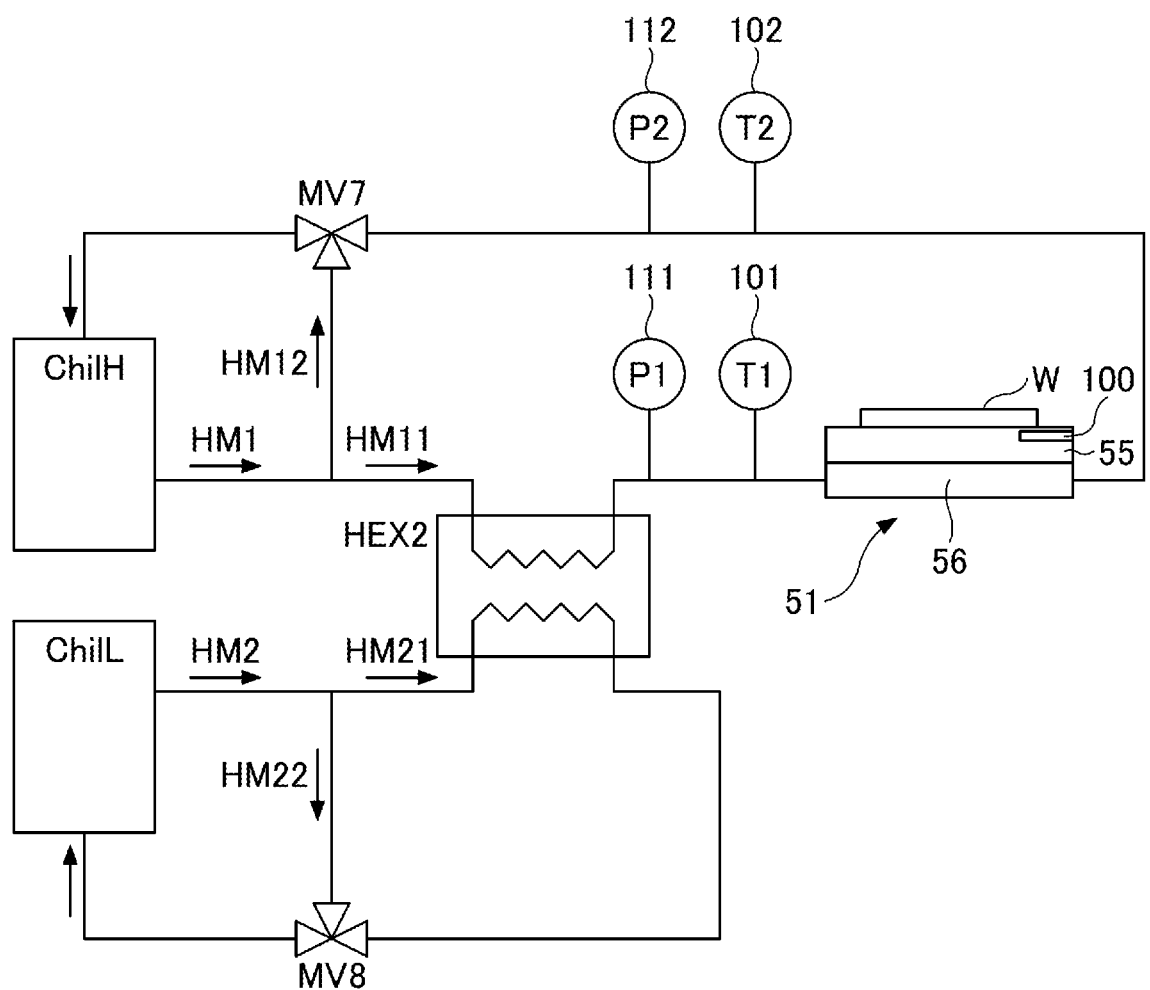
FIG. 13 is a diagram for explaining the flow passage of the heating medium of the inspection system according to a modification of the present embodiment.

An example in which the flow passage of the inspection system 1 according to the present embodiment is modified is illustrated. FIG. 13 is a diagram for explaining the flow passage of the heating medium according to a second modification of the inspection system according to the present embodiment.

The flow passage of the heating medium HM according to the second modification will be described. The heating medium HM1 supplied from the high-temperature chiller unit ChilH and having the temperature Tch is divided into the heating medium HM11 and the heating medium HM12. The heating medium HM11 flows into a heat exchanger HEX2. The heating medium HM12 flows into a three-way valve MV7. Similarly, the heating medium HM2 supplied from the low-temperature chiller unit ChilL and having the temperature Tcl is divided into the heating medium HM21 and the heating medium HM22. The heating medium HM21 flows into the heat exchanger HEX2. The heating medium HM22 flows into a three-way valve MV8. The flow rates of the heating medium HM11 and the heating medium HM21 are controlled by controlling the valve positions of the three-way valves MV7 and MV8, respectively. In the heat exchanger HEX2, a heat exchange occurs between the heating medium HM11 and the heating medium HM21. As a result, the temperature of the heating medium HM11 flowing out of the heat exchanger HEX2 decreases compared to the temperature when flowing into the heat exchanger HEX2. The temperature of the heating medium HM1 flowing out of the heat exchanger HEX2 can be controlled by the flow rates of the heating medium HM11 and the heating medium HM21, respectively. The correction of the target temperature is the same as that of the first modification.

By using the flow passage of the heating medium HM according to the second modification, the flow rates of the heating media HM1 and HM2 supplied from the high-temperature chiller unit ChilH and the low-temperature chiller unit ChilL can be made approximately constant. For this reason, it is possible to make the temperatures of the high-temperature chiller unit ChilH and the low-temperature chiller unit ChilL more stable.

According to the second modification, the three-way valves MV7 and MV8 are provided in the flow passages through which the heating media of the high-temperature chiller unit ChilH and the low-temperature chiller unit ChilL are fed back, respectively, but the locations where the three-way valves MV7 and MV8 are provided are not limited to these flow passages. For example, the three-way valves MV7 and MV8 may be provided in the flow passages from which the heating media of the high-temperature chiller unit ChilH and the low-temperature chiller unit ChilL are supplied, respectively, that is, the flow passages on the inlet side of the heat exchanger HEX2.

The inspection system and the inspection method according to the embodiments disclosed herein are to be considered exemplary in all respects and not limiting. The above described embodiments may be modified and improved in various forms without departing from the scope of the appended claims and spirit thereof. The items of the above described embodiments may have other configurations to the extent not introducing inconsistencies, and may be combined to the extent not introducing inconsistencies.

This application is based upon and claims priority to Japanese Patent Application No. 2019-169728, filed on Sep. 18, 2019, the entire contents of which are incorporated herein by reference.

DESCRIPTION OF THE REFERENCE NUMERALS

1 Inspection system
10 Housing
22 Controller
52 Temperature adjustment mechanism
55 Top plate
56 Cooling jacket
58 Heating medium flow passage
60 Camera
100 Temperature sensor
101 Temperature sensor
102 Temperature sensor
111 Pressure detector
112 Pressure detector
202 Computing unit
ChilH High-temperature chiller unit
ChilL Low-temperature chiller unit
MV1 Three-way valve
MV2 Three-way valve
MV3 Control valve
MV4 Control valve

The invention claimed is:

1. An inspection system comprising:
a first chiller unit configured to supply a first heating medium controlled to a first temperature;
a second chiller unit, separate from the first chiller unit, and configured to supply a second heating medium controlled to a second temperature lower than the first temperature;
a stage having a flow passage supplied with a heating medium mixture mixed with the first heating medium from the first chiller unit and the second heating medium from the second chiller unit at a desired mixing ratio;
and a controller, wherein
the inspection system performs an inspection with respect to a substrate placed on the stage, and
the controller performs a process including
acquiring a temperature of the heating medium mixture at an inlet of the flow passage, and a temperature of the heating medium mixture at an outlet of the flow passage, measured by respective temperature sensors, and
correcting the mixing ratio of the first heating medium and the second heating medium, based on both a flow rate of the heating medium mixture through the flow passage, and a difference between the temperature of the heating medium mixture at the inlet of the flow passage and the temperature of the heating medium mixture at the outlet of the flow passage.

2. The inspection system as claimed in claim 1, wherein the controller performs the process further including
computing a heating value of the substrate, based on the flow rate of the heating medium mixture through the flow passage, and the difference between the temperature of the heating medium mixture at the inlet of the flow passage and the temperature of the heating medium mixture at the outlet of the flow passage, and
correcting the mixing ratio of the first heating medium and the second heating medium, based on the heating value.

3. The inspection system as claimed in claim 1, wherein the controller controls a valve position of a valve at an output of the first chiller unit, and a valve position of a valve at an output of the second chiller unit, so as to determine the corrected mixing ratio.

4. The inspection system as claimed in claim 1, wherein the controller performs the process further including
acquiring a pressure of the heating medium mixture at the inlet of the flow passage, and a pressure of the heating medium mixture at the outlet of the flow passage, measured by respective pressure detectors,
wherein the flow rate of the heating medium mixture through the flow passage is determined from a difference between the pressure of the heating medium mixture at the inlet of the flow passage and the pressure of the heating medium mixture at the outlet of the flow passage.

5. The inspection system as claimed in claim 4, further comprising:
a first temperature sensor configured to measure the temperature of the heating medium mixture at the inlet of the flow passage;
a second temperature sensor configured to measure the temperature of the heating medium mixture at the outlet of the flow passage;
a first pressure detector configured to measure the pressure of the heating medium mixture at the inlet of the flow passage; and
a second pressure detector configured to measure the pressure of the heating medium mixture at the outlet of the flow passage.

6. The inspection system as claimed in claim 1, further comprising:
a first three-way valve to which the first heating medium is supplied, and from which a portion of the supplied first heating medium flows into the flow passage; and
a second three-way valve to which the second heating medium is supplied, and from which a portion of the supplied second heating medium flows into the flow passage,
wherein the first three-way valve is located at an output of the first chiller unit, and the second three-way valve is located at an output of the second chiller unit.

7. An inspection system comprising:
a first chiller unit configured to supply a first heating medium controlled to a first temperature;
a second chiller unit, separate from the first chiller unit, and configured to supply a second heating medium controlled to a second temperature lower than the first temperature;
a stage having a flow passage supplied with the first heating medium which is reduced to a desired target temperature by a heat exchange between the first heating medium and the second heating medium; and
a controller, wherein
the inspection system performs an inspection with respect to a substrate placed on the stage, and
the controller performs a process including
acquiring a temperature of the first heating medium at an inlet of the flow passage, and a temperature of the first heating medium at an outlet of the flow passage, measured by respective temperature sensors, and
correcting the target temperature, based on both a flow rate of the first heating medium through the flow passage, and a difference between the temperature of the first heating medium at the inlet of the flow passage and the temperature of the first heating medium at the outlet of the flow passage.

8. The inspection system as claimed in claim 7, wherein the controller controls a valve position of a valve at an output of the first chiller unit, and a valve position of a valve at an output of the second chiller unit, so as to determine the corrected mixing ratio.

9. The inspection system as claimed in claim 7, further comprising:
   a first three-way valve to which the first heating medium is supplied, and from which a portion of the supplied first heating medium flows into the flow passage; and
   a second three-way valve to which the second heating medium is supplied, and from which a portion of the supplied second heating medium flows into the flow passage,
   wherein the first three-way valve is located at an output of the first chiller unit, and the second three-way valve is located at an output of the second chiller unit.

10. The inspection system as claimed in claim 7, further comprising:
    a first temperature sensor configured to measure the temperature of the first heating medium at the inlet of the flow passage;
    a second temperature sensor configured to measure the temperature of the first heating medium at the outlet of the flow passage; and
    a flow meter configured to measure the flow rate of the first heating medium through the flow passage.

11. An inspection method implemented in an inspection apparatus comprising a first chiller unit configured to supply a first heating medium controlled to a first temperature, a second chiller unit, separate from the first chiller unit, and configured to supply a second heating medium controlled to a second temperature lower than the first temperature, and a stage having a flow passage supplied with a heating medium mixture mixed with the first heating medium and the second heating medium at a desired mixing ratio,
    the inspection method performing an inspection with respect to a substrate placed on the stage, and comprising:
    measuring a temperature of the heating medium mixture at an inlet of the flow passage and a temperature of the heating medium mixture at an outlet of the flow passage; and
    correcting the mixing ratio of the first heating medium and the second heating medium, based on both a flow rate of the heating medium mixture through the flow passage, and a difference between the temperature of the heating medium mixture at the inlet of the flow passage and the temperature of the heating medium mixture at the outlet of the flow passage.

12. The inspection method as claimed in claim 11, further comprising:
    computing a heating value of the substrate, based on the flow rate of the heating medium mixture through the flow passage, and the difference between the temperature of the heating medium mixture at the inlet of the flow passage and the temperature of the heating medium mixture at the outlet of the flow passage; and
    correcting the mixing ratio of the first heating medium and the second heating medium, based on the heating value.

13. The inspection method as claimed in claim 11, further comprising:
    measuring a pressure of the heating medium mixture at the inlet of the flow passage, and a pressure of the heating medium mixture at the outlet of the flow passage,
    wherein the flow rate of the heating medium is determined from a difference between the pressure of the heating medium mixture at the inlet of the flow passage and the pressure of the heating medium mixture at the outlet of the flow passage.

14. The inspection method as claimed in claim 13, wherein:
    the measuring the temperature includes measuring the temperature of the heating medium mixture at the inlet of the flow passage by a first temperature sensor, and measuring the temperature of the heating medium mixture at the outlet of the flow passage by a second temperature sensor; and
    the measuring the pressure includes measuring the pressure of the heating medium mixture at the inlet of the flow passage by a first pressure detector, and measuring the pressure of the heating medium mixture at the outlet of the flow passage by a second pressure detector.

* * * * *